United States Patent [19]

Masuda

[11] Patent Number: 5,504,339

[45] Date of Patent: Apr. 2, 1996

[54] METHOD OF REPAIRING A PATTERN USING A PHOTOMASK PATTERN REPAIR DEVICE

[75] Inventor: Satoshi Masuda, Tokyo, Japan

[73] Assignee: Kabushiki Kaisha Toshiba, Kawasaki, Japan

[21] Appl. No.: 327,898

[22] Filed: Oct. 27, 1994

[30] Foreign Application Priority Data

Oct. 28, 1993 [JP] Japan .................................. 5-270964

[51] Int. Cl.⁶ ...................... H01J 37/317; H01J 37/304
[52] U.S. Cl. .................... 250/492.21; 250/491.1
[58] Field of Search ............................ 250/492.21, 491.1

[56] References Cited

U.S. PATENT DOCUMENTS

| 4,683,378 | 7/1987 | Shimase et al. ................... 250/491.1 |
| 5,086,230 | 2/1992 | Adachi et al. ................... 250/492.21 |

FOREIGN PATENT DOCUMENTS 58-56332 4/1983 Japan .
1-309245 12/1989 Japan .

Primary Examiner—Jack I. Berman
Attorney, Agent, or Firm—Finnegan, Henderson, Farabow, Garrett & Dunner

[57] ABSTRACT

According to a method of repairing a pattern using a photomask pattern repair device of the present invention, a reference point is set within a reference point confirmation scanning area on a pattern member and near a pattern repair range on the pattern member, and a protection film is formed by a material other than that of an underlying member, so as to cover the reference point confirmation scanning area. A through hole is then formed so as to penetrate only the protection film. The scanning area is scanned with a charged particle beam to cause a secondary ion to be emitted from the underlying member only through the through hole. The secondary ion is detected to confirm a reference position corresponding to the through hole. When a variation in the orbit of the charged particle beam is detected from the confirmed reference position, the position of the charged particle beam is corrected in accordance with an amount of drift of the variation.

2 Claims, 4 Drawing Sheets

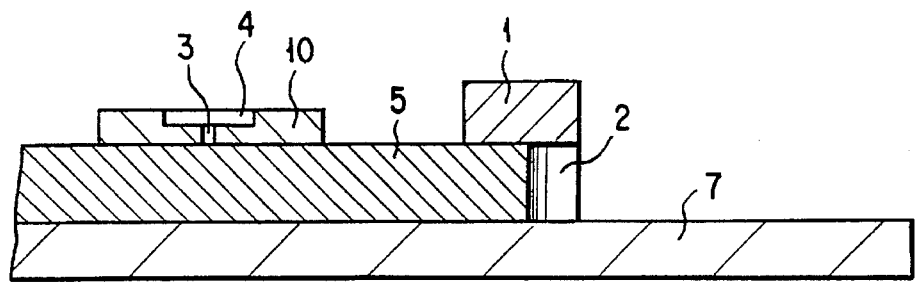
F I G. 12
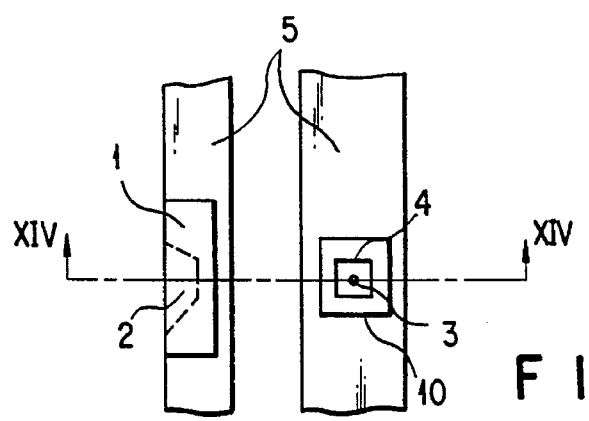
F I G. 13
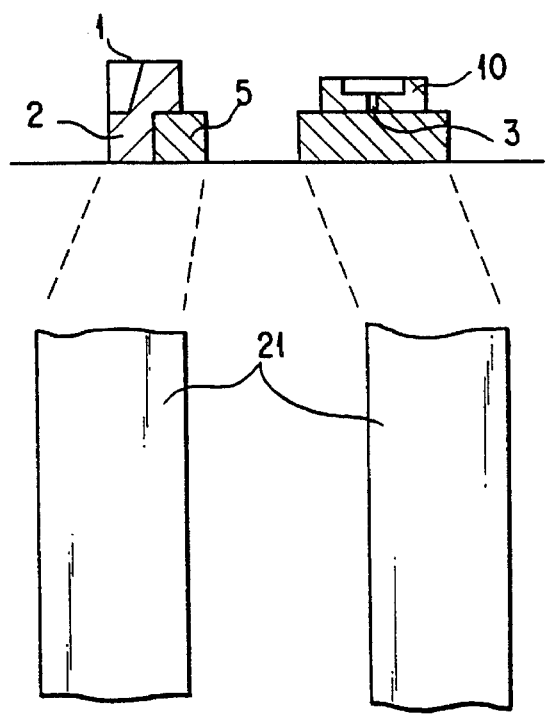
F I G. 14

METHOD OF REPAIRING A PATTERN USING A PHOTOMASK PATTERN REPAIR DEVICE

BACKGROUND OF THE INVENTION

1. Field of the Invention

The present invention relates to a method of repairing a pattern using a photomask pattern repair device capable of eliminating a drawback caused when a reference point for detecting an amount of drift of the orbit of a charged particle beam is confirmed.

2. Description of the Related Art

A prior art method of repairing a pattern using a photomask pattern repair device, including a process of forming a glass mask, will now be described, with reference to the accompanying drawings.

FIG. 1 is a plan view showing the whole of a mask pattern and an enlarged view showing a part thereof.

A mask 19, shown in FIG. 1, is obtained by applying a thin film, which contains chromium as the principal ingredient and serves as a shield member, to a quartz glass substrate (not shown) by sputtering or the like.

For example, an EB(Electron Beam) resist is uniformly applied onto the mask 19 and dehydrated. A pattern is drawn on the resist by using an EB pattern drawing apparatus in accordance with pattern data, and then developed. Using the pattern formed on the resist as a mask, the metallic thin film is etched.

After the pattern is completed by the etching of the metallic thin film, the resist is removed, and the resultant structure is washed. After that, registration and critical dimension are measured, and the shape and appearance of a defect in the pattern are inspected. It is only the wafers passed in these measurements and inspections that are placed in a stepper for exposure.

A main pattern section 20, enlarged in FIG. 1, includes a glass substrate 7 and a pattern 5 formed of chromium on the substrate 7 and having a clear defective portion 2. The clear defective portion 2 is detected through a defect shape inspection and repaired by using a carbon or metallic thin film.

The conventional method of repairing a defect in pattern is classified roughly into the following three methods: a lift-off method, a laser repair using a laser beam, and an FIB (Focus Ion Beam) pattern repair using a focus ion beam. The FIB pattern repair includes a method of removing a defect in pattern by etching using an ion beam and a method of repairing a defect in pattern by forming a light shield film so as to cover the defect which is sprayed with a deposition gas and irradiated with an ion beam.

A generally-known FIB pattern repair device is disclosed in, for example, Jpn. Pat. Appln. KOKAI Publications No. 58-56332. One example of the FIB pattern repair device is shown in FIG. 2.

When a pattern formed on a glass substrate 7 placed on a stage 18 is in need of repair, an ion beam 6 is emitted from an ion source 11 and focused upon the substrate 7 through a limiting aperture 12, thereby removing or repairing a defect in the pattern. The focus position of the ion beam can be arbitrarily changed by deflecting the orbit thereof by means of a deflector 14.

A gas gun 15 is provided to generate gas when a protection film serving as a light shield film is formed on a Cr (chromium) film of a pattern member. A Cr secondary ion detector 16 detects a Cr secondary ion 13 generated from the Cr film while a charged particle beam is scanning. An Si secondary ion detector 17 detects an Si secondary ion 13 generated from the glass substrate 7 which is an underlying member of a through hole formed in the protection film and corresponding to a reference point.

The pattern repair using the conventional FIB pattern repair device mentioned above, is performed as follows.

FIG. 3 is a view of a portion of the main pattern section 20 shown in FIG. 1.

In order to repair the defective portion 2 of the pattern member 5 constituted by the Cr film, the portion 2 is irradiated with an ion beam and then sprayed with a gas from the gas gun 15, thereby forming a repairing carbon film 1 covering the defective portion 2.

However, the use of the ion beam sometimes causes a beam drift and makes the beam unstable since the beam source is thermally changed.

The shift in orbit of the ion beam is corrected by detecting a position of the beam with respect to the reference point and changing the orbit based on the mount of drift corresponding to the detected position. According to this correction, which is disclosed in, for example, Jpn. Pat. Appln. KOKAI Publication No. 1-309245, a hole is formed, by the ion beam, as a reference point 3 in that part of the pattern member 5 which is in the vicinity of the defective portion 2. The hole is usually formed such that it penetrates the pattern member and reaches the glass substrate.

The repairing carbon film 1 as a repairing area is formed around the defective portion 2 on the basis of the reference point 3 to start repairing the defective portion 2. In order to confirm whether the orbit of an ion beam varies or not during the repair, it is confirmed whether a distance from the orbit position of the currently emitting ion beam to the reference point 3 is maintained or not. A reference point confirmation area 4 is scanned with the ion beam at regular intervals to confirm that the reference point 3 is located in the center of the area 4.

FIG. 4 is an enlarged plan view showing the reference point 3 and reference point confirmation area 4 formed in the pattern member 5, and FIG. 5 is a cross-sectional view taken along the line V—V of FIG. 4.

The reference point confirmation area 4 is scanned with the ion beam at regular intervals of, e.g., a few minutes to several tens of minutes. If the reference point 3 falls within the scanning range, an Si secondary ion having a steep waveform, as shown in FIG. 6, is generated from only the hole of the reference point 3, thereby confirming the position of the reference point.

If the reference point 3 is shifted from the center of the reference confirmation area 4, the shift is corrected as an amount of drift correction. This correction operation is repeated at regular intervals during the repairing operation.

However, the conventional pattern repairing method described above, has the following drawback.

To confirm the position of the reference point 3, the reference point confirmation area 4 is repeatedly scanned several times by several times at regular intervals and, consequently, the Cr film of the reference point confirmation area 4, shown in FIG. 5 is extremely thinned. If, therefore, the number of scans is large, a light leak causes when the pattern is transferred to a wafer, and a new defect is likely to occur on the wafer.

FIGS. 7 and 8 show an example wherein, even if the defective portion 2 of the pattern member 5 is repaired by the repairing carbon film 1, a new defective portion 23 occurs on the repaired transfer pattern 21 since the Cr film of the reference point confirmation area 4 is thinned by scanning the area 4 with the charged particle beam.

The reference point 3, which is not currently in question, is transferred onto the wafer as a pattern, indicated by reference numeral 22 in FIG. 8, as the limit of transfer to the wafer (the resolution of resist) improves in future, with the result that the reference point itself is likely to be formed as a new defect.

In order to eliminate the above drawback, a method of limiting the total number of scans for confirming the reference point is adopted. However, when the reference point is difficult to confirm, the total number of scans reaches a predetermined limit before the repair is completed, and the original repairing operation cannot be continued any longer.

If there is no pattern member of a Cr film for forming a hole serving as the reference point 3 in the vicinity of a defective portion, the foregoing repairing method cannot be employed.

In the prior art repairing method described above, the mass of the Si secondary ion, which is generated as a reference signal from the hole of the reference point 3, is lighter than that of Cr. If foreign substances 8 each having a mass similar to that of Si is present near the reference point 3 as shown in FIG. 9, other secondary ions due to the substances 8 are detected even at positions 9 other than the reference point 3 as shown in FIG. 10, with the result that the correct position of the reference point 3 cannot be determined.

As described above, the prior art repairing method has the drawback wherein a different secondary ion, which has a mass similar to that of Si and is unstable as a reference signal, is easy to be detected by mistake.

SUMMARY OF THE INVENTION

The present invention has been developed to resolve the above drawback, and its object is to provide a method of repairing a pattern using a photomask pattern repair device, wherein a through hole corresponding to a reference point for detecting an amount of drift of a charged particle beam is formed in a protection film, which is formed on a pattern member, for protecting an underlying member and near a clear defective portion therein in order to prevent any damage from being caused to the pattern member even by a large number of scans of the charged particle beam, thereby preventing a new defective portion from occurring at the time of pattern transfer.

To attain the above object, there is provided a method of repairing a pattern by using a photomask pattern repair device, the photomask pattern repair device comprising: a charged particle beam source for emitting and focusing a charged particle beam upon a resist applied to a thin film formed on a glass substrate to repair a pattern; a deflector for deflecting the charged particle beam emitted from the charged particle beam source in accordance with the pattern to be repaired; gas generation means for generating gas to form a protection film on the glass substrate; a secondary ion detector, provided on the protection film, for detecting a secondary ion generated only from a through hole of a reference point within a scanning area when the scanning area is scanned with the charged particle beam; and correction means for correcting a variation in focusing position of the charged particle beam, the method comprising the steps of:

designating a pattern repairing range upon receipt of positional information of a pattern member to be repaired;

setting the reference point of the scanning area close to the pattern repairing range;

forming the protection film for protecting an underlying member, in an area larger than the scanning area, the protection film being formed by a material other than a material of the underlying member;

providing a through hole at the reference point, the through hole corresponding to a reference position for detecting an amount of drift of the charged particle beam and penetrating only the protection film;

scanning the scanning area with the charged particle beam and detecting a secondary ion signal generated from the underlying member only through the through hole, thereby to confirm the reference position; and scanning the scanning area with the charged particle beam again while calculating a relative distance between the through hole and a target defective portion within the pattern repairing range and, when a variation in an orbit of the charged particle beam is detected from the reference position, correcting a position of the charged particle beam in accordance with an amount of drift of the variation.

According to the above-described pattern repairing method of the present invention, since the through hole corresponding to the reference position for detecting an amount of drift of the charged particle beam, is provided in the protection film formed on a pattern member and near a defective portion on the pattern member, any damage is not caused to the pattern member even by a plurality of scans for the charged particle beam, or a new defective portion does not occur when the pattern is formed on a wafer, thus eliminating the drawback caused at the time of the pattern transfer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 12 is a cross-sectional view taken along the line XII—XII of FIG. 11;

FIG. 13 is a partial plan view showing an example of the present invention wherein a protection film is formed on a pattern member 5 adjacent to another pattern member 5 having a defective portion 2; and FIG. 14 is a cross-sectional view taken along the line XIV—XIV of FIG. 13 and showing a repaired transfer pattern having no defects.

DETAILED DESCRIPTION OF THE PREFERRED EMBODIMENT

A method of repairing a pattern using an ion beam will now be described, as an embodiment of the present invention, with reference to the accompanying drawings.

The pattern repair using the ion beam can be replaced with a drawing using a laser beam or patterning by photo transfer.

If a pattern of a mask placed on a stage is inspected by means of a mask defect inspection device (not shown) and defects in the pattern are detected, information of the defects is transmitted from the inspection device to an FIB pattern repair device through a communications network among magnetic cards or computers. In the FIB pattern repair device, the defects in the pattern of the mask are moved in sequence to an area to be irradiated with an ion beam based on the information, and then repaired.

The pattern repairing method of the present invention will be described more specifically, with reference to FIGS. 11 and 12.

Figure 1:
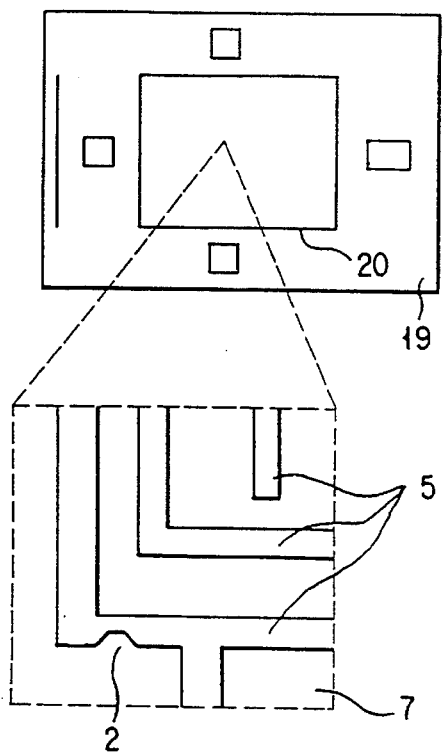
FIG. 1 is a plan view showing the whole of a conventional mask pattern and an enlarged view of part of the mask pattern.
Figure 2:
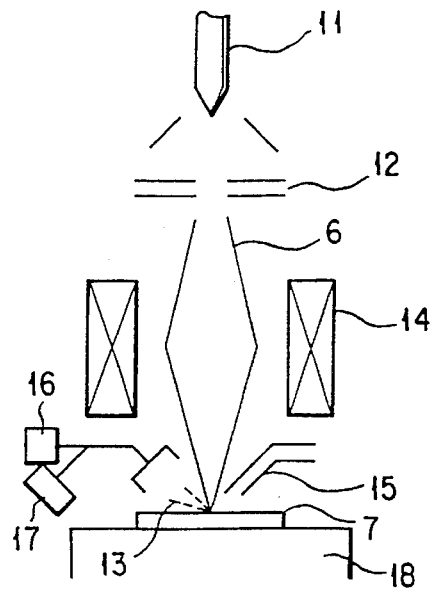
FIG. 2 is a view schematically showing a constitution of a conventional FIB pattern repair device.
Figure 3:
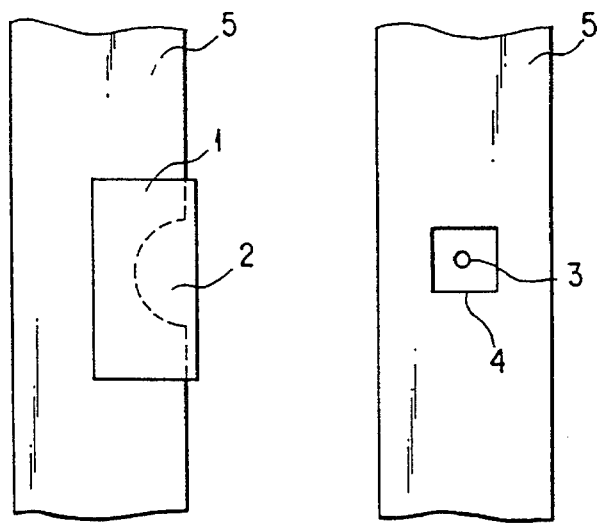
FIG. 3 is a view showing part of a main pattern section 20 of the mask pattern of FIG. 1.
Figure 4:
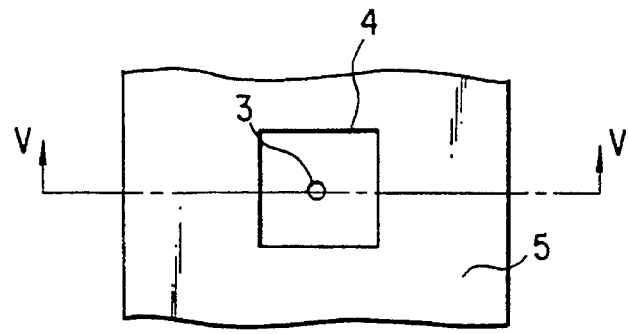
FIG. 4 is an enlarged plan view showing a reference point 3 and a reference point confirmation area 4 on a pattern member 5.
Figure 5:
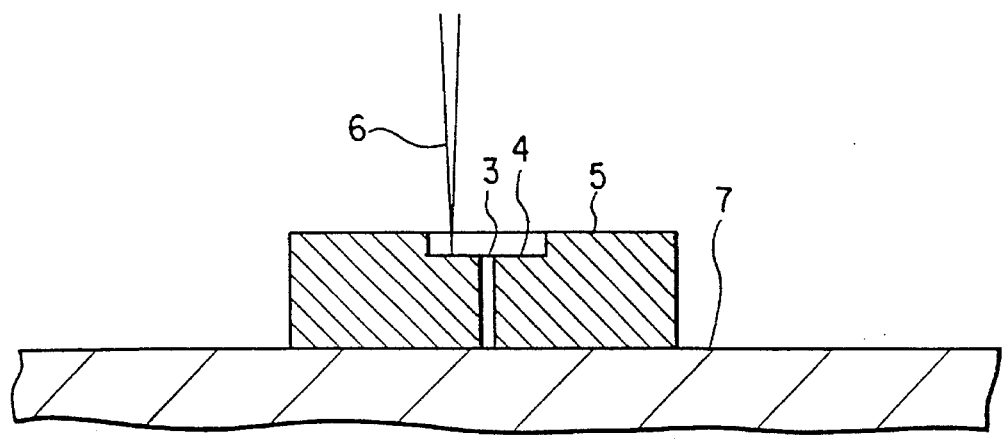
FIG. 5 is a cross-sectional view taken along the line V—V of FIG. 4.
Figure 6:
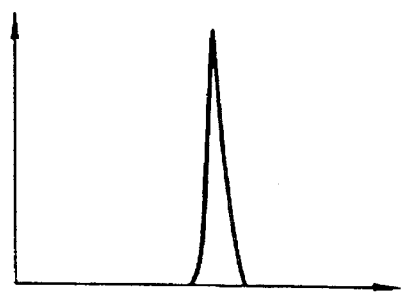
FIG. 6 is a view showing a steep waveform of an Si secondary ion generated only from a hole of the reference point.
Figure 7:
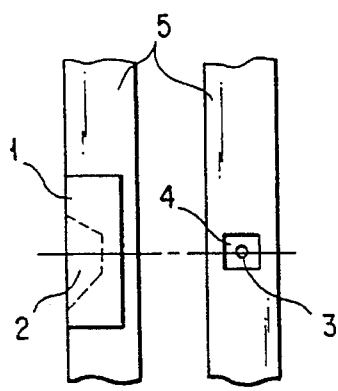
FIG. 7 is a view showing a prior art relationship in arrangement between a reference point 3 and a reference confirmation area 4 of a pattern member 5 arranged adjacent to a pattern member 5 having a defective portion 2.
Figure 8:
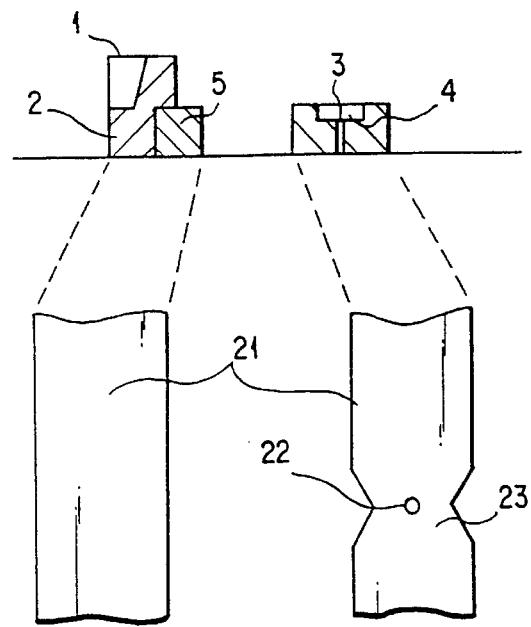
FIG. 8 is a cross-sectional view taken along the line VIII—VIII of FIG. 7 and showing an example wherein a new defect portion occurs on a repaired transfer pattern.
Figure 9:
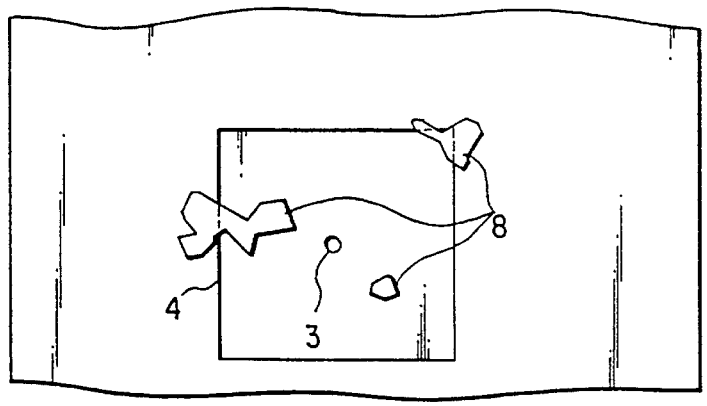
FIG. 9 is a view showing an example wherein foreign substances are present near the reference point 3 within the reference confirmation area 4.
Figure 10:
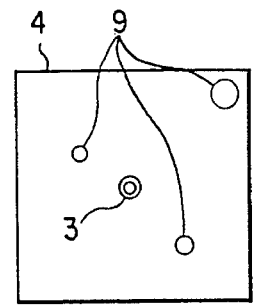
FIG. 10 is a view showing an example wherein the secondary ions are detected from other than the reference point by the foreign substances shown in FIG. 9.
Figure 11:
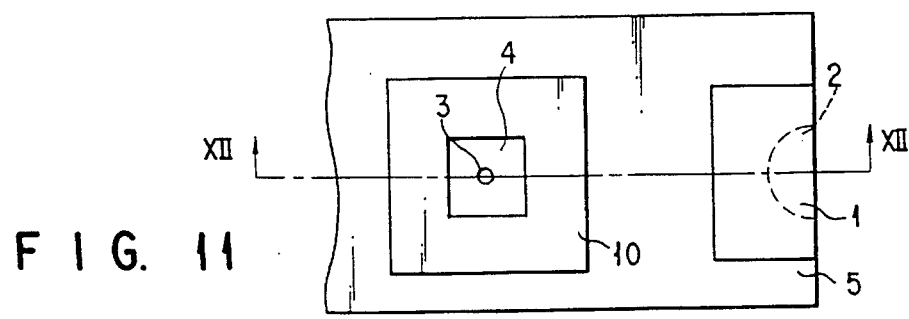
FIG. 11 is a partial plan view showing a relationship in position between a defective portion 2 and a reference point 3 on a pattern member for explaining a pattern repairing method of the present invention using a photomask pattern repair device.

As shown in FIG. 11, a reference point 3 is set on the same pattern member as a pattern member 5 having a defective portion 2 prior to the recognition of a position where the defective portion is to be repaired, and an area for confirming the reference point 3 located in the center thereof is defined as a reference point confirmation scanning area 4 to be scanned with an ion beam.

A protection film 10 including the reference point confirmation scanning area 4, is formed on the pattern member 5. The thickness of the protection film 10 is set to such an extent as shown in FIG. 12 that an underlying member cannot be exposed even though the reference point is scanned an expected number of times. When pyrene gas is used to repair a normal clear pattern defect, if the thickness of a carbon deposition film is 1000 angstroms, an underlying member can be sufficiently protected. In this embodiment, the underlying member corresponds to a Cr film of the pattern member 5 and a glass member 7.

A hole of the reference point 3 is formed so as to penetrate only the protection film 10, and the reference point confirmation scanning area 4, which is defined by setting the hole in the center of the area 4, is scanned with an ion beam. Consequently, a secondary ion signal generated from the underlying member, that is, the pattern member 5 through the hole of the reference point 3, is detected thereby to confirm the location of the reference point 3.

After the confirmation of the reference point 3, a relative distance between a defect repairing area 1 and the reference point 3 is calculated and stored. The defect repairing area 1 is scanned with an ion beam while being sprayed with the pyrene gas from a nozzle, and a carbon deposition film is selectively formed only on the part of the area 1 irradiated with the ion beam, thereby repairing the defective portion 2.

In order to detect whether the orbit of the ion beam is shifted or not after a lapse of a predetermined period of time after the repair is started, the reference point confirmation scanning area 4 is scanned again to search for the reference point 3.

If the reference point 3 is recognized to fall within the area 4, a relative distance between the defect repairing area 1 and the recognized reference point 3 is calculated again, and a beam scan is restarted to repair a defect in the repairing area 1. If the reference point 3 is displaced from the center of the reference point confirmation scanning area 4, the repairing area 1 is shifted by the amount of the displacement.

If the reference point 3 does not fall within the area 4, the orbit of the beam is shifted so greatly that an amount of drift cannot be detected. When the shift of the orbit cannot be corrected, the area 4 is searched again for the original reference point 3 without any correction, and the beam scan is restarted.

By repeating the beam scan, the repair on the defective portion 2 is continued until the thickness of the carbon deposition film reaches a predetermined value, while the orbit of the beam is being corrected. This method of repairing a pattern by correcting the orbit of a scanning beam, can be attained by using the technique disclosed in the Japanese prior art publications mentioned above.

FIG. 13 is a partial plan view showing an example where, on a pattern member 5 adjacent to a pattern member 5 on which a deflect occurs, a protection film 10 is provided for protecting an underlying member separate from the pattern member 5.

FIG. 14 is a cross-sectional view, taken along XIV to XIV in FIG. 13, showing that, after correction, a transfer pattern 21 is obtained without involving any defect.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of repairing a pattern formed on a resist applied to a thin film formed on a glass substrate by using a photomask pattern repair device, said method comprising the steps of:

designating a pattern repairing range upon receipt of positional information of the pattern to be repaired;

setting a reference point of a scanning area close to the pattern repairing range;

forming a protection film for protecting the glass substrate and the thin film, in an area larger than the scanning area, said protection film being formed by a material other than material of the glass substrate and the thin film;

providing a through hole at the reference point, said hole corresponding to a reference position for detecting an amount of drift of a charged particle beam emitted from a charged particle beam source in the pattern repair device, and penetrating only the protection film;

scanning the scanning area with the charged particle beam and detecting a secondary ion signal generated from the glass substrate and the thin film only through the through hole, thereby to confirm the reference position; and scanning the scanning area with the charged particle beam again while calculating a relative distance between the through hole and a target defective portion within the pattern repairing range and, when a variation in an orbit of the charged particle beam is detected from the reference position, correcting a position of the charged particle beam in accordance with an amount of drift of the variation.

2. The method according to claim 1, wherein the protection film is formed by a material other than the materials of the pattern and the glass substrate.

* * * * *